Figure 3:
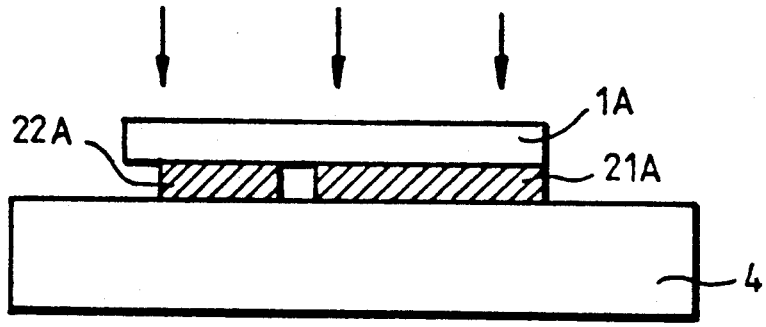

United States Patent [19]

Breger

[11] Patent Number: 5,021,112

[45] Date of Patent: Jun. 4, 1991

[54] PROCESS OF MULTICOLOR PRINTING BY LASER

[76] Inventor: Guy Breger, 10 Chemin des Violettes, Rosoy-Sens (Yonne), France

[21] Appl. No.: 383,206

[22] Filed: Jul. 19, 1989

[30] Foreign Application Priority Data

Jul. 26, 1988 [FR] France .................... 88 10052

[51] Int. Cl.$^5$ ................ B41M 1/18; B44C 3/02
[52] U.S. Cl. ...................... 156/305; 101/211; 219/121.69; 427/53.1
[58] Field of Search ............. 101/211, 483, 490, 492, 101/468, 471, 467, 469, 470, 473; 219/121.68, 121.69; 346/76 L; 427/53.1; 156/23 S, 305

[56] References Cited

U.S. PATENT DOCUMENTS

| | | | |
|---|---|---|---|
| 2,972,298 | 2/1961 | DeMarchi et al. | 101/211 |
| 3,770,936 | 11/1973 | Rively et al. | 219/121.68 |
| 4,245,003 | 1/1981 | Oransky et al. | 101/467 X |
| 4,323,755 | 4/1982 | Nierenberg | 219/121.69 |
| 4,515,867 | 5/1985 | Bleacher et al. | 427/53.1 X |
| 4,534,288 | 8/1985 | Brovman | 101/211 |

FOREIGN PATENT DOCUMENTS

| | | | |
|---|---|---|---|
| 89629 | 9/1983 | European Pat. Off. | 101/211 |
| 39457 | 3/1983 | Japan | 101/473 |

Primary Examiner—Clifford D. Crowder
Attorney, Agent, or Firm—Hughes & Multer

[57] ABSTRACT

A process of multicolor printing where a first sheet with a layer of a first color material thereon has a portion of said first color material destroyed by a laser to leave a first image of said first colored material. The first image is then transferred to a permanent support. A second sheet with a layer of a second color material has a layer applied thereto to leave a second image of said second material, which second image is also applied to the premanent support to make a combined image. The same procedure can be followed with third and fourth colored materials to provide third and fourth images superimposed over the first and second images.

10 Claims, 3 Drawing Sheets

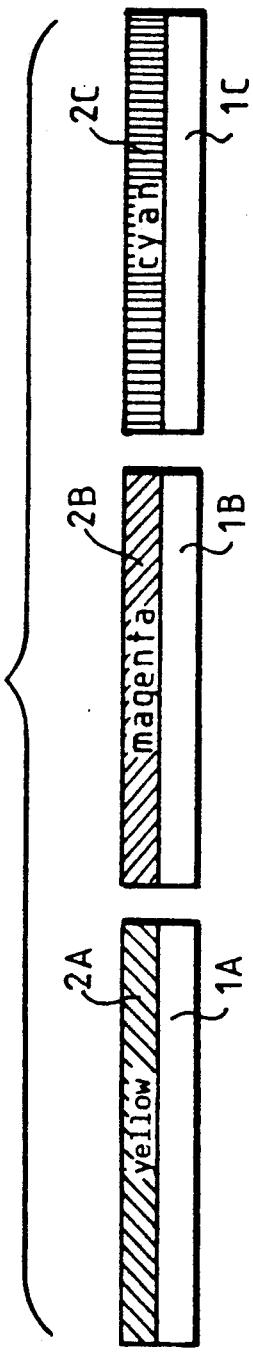
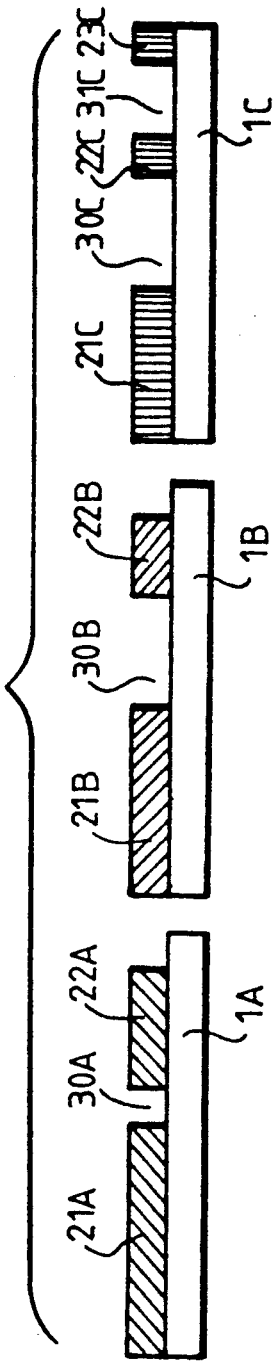

PROCESS OF MULTICOLOR PRINTING BY LASER

This invention concerns a process of multicolour printing by laser.

It is already known that the light beam from a laser source can be used to mark objects. This marking is achieved by evaporation or fusion of the material on the surface of the object. The surface thus treated by the laser beam changes shade or colour. It is in this way, for example, that the coloured surface of a sheet of paper turns white where the laser beam has impinged on it.

However, using this process, only printing by "overprinting" in white can be carried out.

There are, in addition, many processes of colour printing, for example photographic or electrostatic processes, processes using photo-polymers, dyes, ink jets or thermal processes.

However, none of these known printing processes uses printing inks or printing supports.

The aim of the present invention is to create a very simple and precise process of multicolour printing.

To this end, the invention concerns a process of the above type, characterised in that:

A) One sheet of a first colour to be printed is produced using a temporary support which is covered with said first colour;

B) Using a laser beam, the areas of the colour of this sheet of colour which are not to be printed are destroyed, so as to leave only the areas of the colour which are to be printed in such a way as to form on the temporary support the image of said first colour, an image symmetrical with the image to be printed;

C) Said image of said first colour is transferred with correct register onto a permanent support, by reversal;

D) The same process is carried out in accordance with points A, B, C for each of the other colours to be printed.

In accordance with a particularly interesting characteristic, after the transfer of the image of one colour onto the permanent support, which may or may not already have other colour images on it, the temporary support is removed.

In accordance with another characteristic of the invention, the colours to be printed are the primary colours with black in addition.

If appropriate, the colours are not limited to the primary colours, and other colours or shades of colours may be used according to requirements.

In a particularly simple fashion, the colours are printing inks.

It is particularly advantageous to apply the process to supports known as "permanent" supports, such as transparent or opaque supports, paper or metal slated supports, coloured surfaces, etc.

Figure 4:
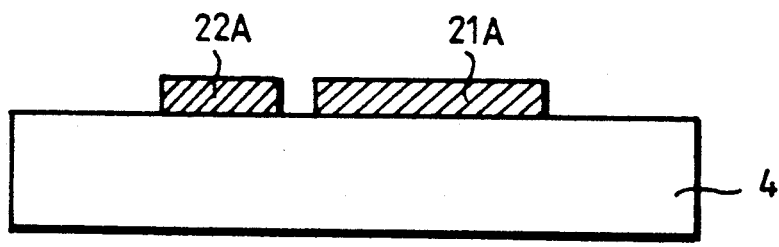
Figure 5:
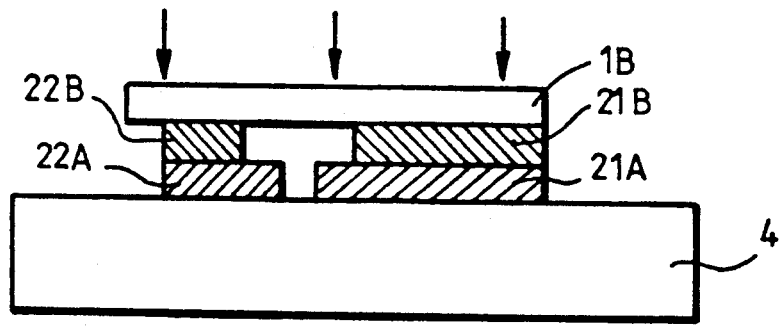
Figure 6:
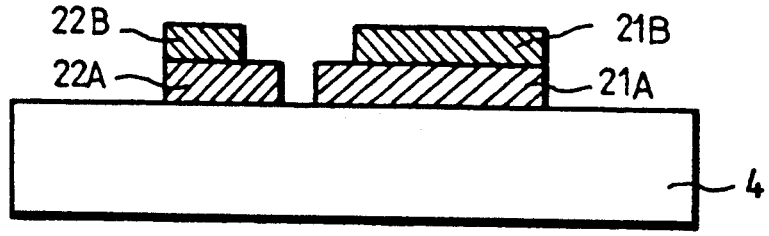
Figure 7:
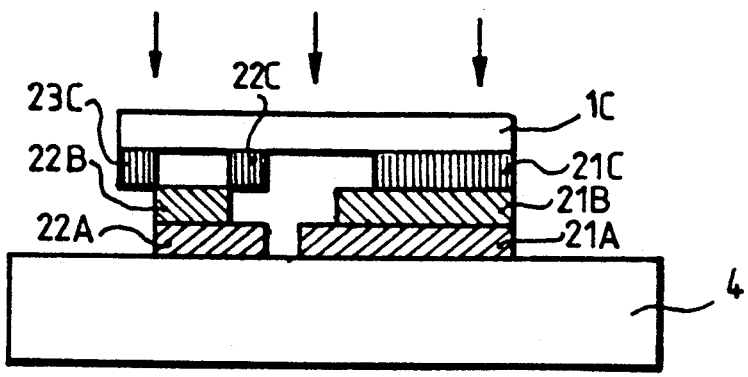
Figure 8:
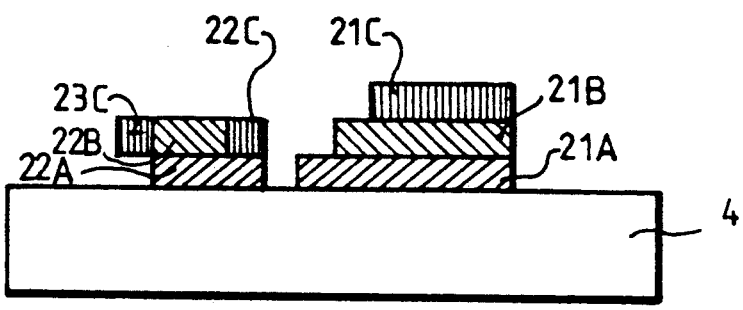
Figure 9:
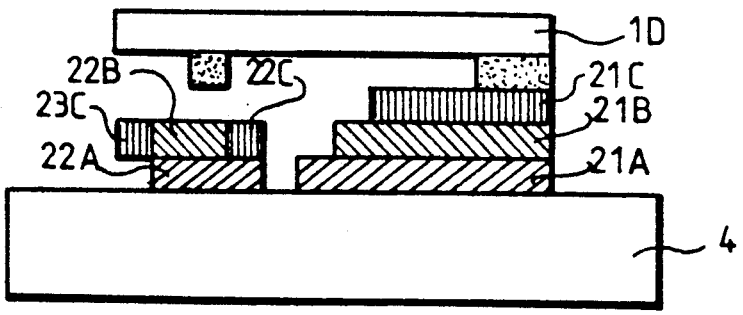
Figure 10:
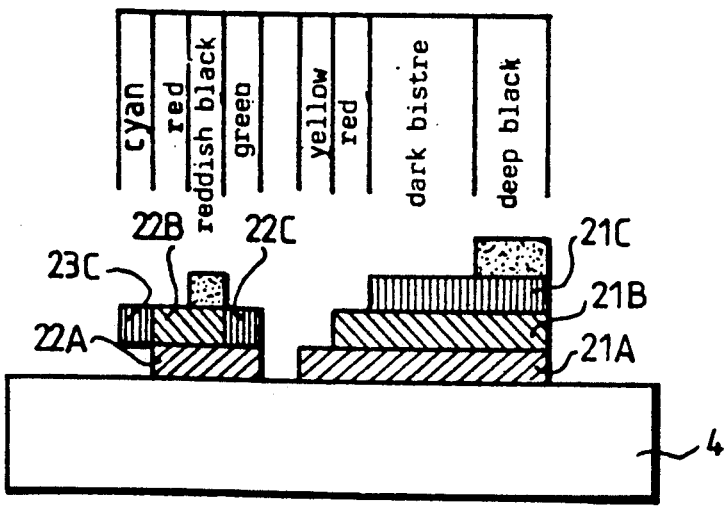

This invention will be described in more detail using an example of an embodiment of the process, shown in the attached drawings in which:

FIG. 1 shows the starting point of the process of the invention,

FIG. 2 shows the result obtained after the treatment of the sheets of colour using a laser beam, FIG. 3 shows the transfer of a first sheet of colour, FIG. 4 shows the result of the transfer of a first colour after removing the temporary support, FIG. 5 shows the transfer of the second colour onto the permanent support already furnished with the first colour, FIG. 6 shows the result of the transfer in accordance with FIG. 5 after taking away the temporary support, FIG. 7 shows the transfer of the third colour, FIG. 8 shows the result of the transfer in FIG. 7 after taking away the temporary support of the third colour, FIG. 9 shows the transfer of the fourth colour, FIG. 10 shows the result obtained by the various operations, in accordance with FIGS. 1 to 9.

In accordance with the process of the invention shown in FIGS. 1 to 9, a sheet of a first colour to be printed is produced (FIG. 1), this sheet consisting of a temporary support 1A coated with a first colour 2A. A sheet of a second colour is produced in the same way, consisting of a temporary support 1B coated with a second colour 2B; in the same way a sheet of a third colour is produced, consisting of a temporary support 1C and a third colour 2C.

These colours are, for example, the primary colours yellow, magenta and cyan; other colours can however be used just as well.

In addition, and in accordance with practice in the printing trade, a sheet of a fourth colour is generally produced, which is, for example, black.

This sheet is not shown in FIG. 1.

The sheets as shown in FIG. 1 may be produced at the start of the process of the invention; alternatively they may be sheets prepared in advance.

FIG. 2 shows the second stage of the process. In accordance with this stage, using a laser beam, the image of the corresponding colour is reproduced on each of the sheets of FIG. 1. This means that, using a laser beam, the areas of the layer of colour 2A, 2B or 2C which are not to be reproduced are burned. Thus, diagrammatically, there are on the temporary support 1A two layers of colour 21A, 22A and a burned space 30A. The same applies to the other sheets on the temporary supports 1B and 1C.

The areas of colour 21A, 22A, 21B, 22B, 21C, 22C, 23C which remain on the temporary supports 1A, 1B, 1C correspond to the colour image obtained, for example, by analysis of the specimen image not shown.

As this analysis does not form part of the present invention and corresponds to known techniques and equipment, it will not be described here.

It should be noted that the layers of colour 21A, 22A, 21B, 22B, 21C, 22C, 23C are symmetrical, and planar with the layers of colour on the image to be produced, as will become clear hereinafter.

Thus, in accordance with the second stage of the process, the areas of colour which are not to be printed are erased from the sheet using a laser beam, so as to leave remaining only the areas of colour to be printed forming on the temporary support the image of each of the colours; this image is symmetrical with the image to be printed.

FIG. 3 shows the third stage of the process.

In accordance with FIG. 3, the image of the first colour (temporary support 1A, layer of colour 21A, 22A) is transferred with correct register onto a permanent support 4 on which it is desired to produce the impression.

This transfer is effected by reversal, which explains why the image 21A, 22A has to be symmetrical in the same plane as the final image to be produced.

In accordance with FIG. 4, which shows the fourth stage of the process, the temporary support 1A is removed so as to leave on the permanent support 4 only the layers of colour 22A, 21A.

In accordance with FIG. 5, the operation of FIGS. 3 and 4 is repeated for the second colour image comprising the temporary support 1B and the layers of colour 21B, 22B.

In accordance with FIGS. 7 and 8, the same procedure is used for the third sheet of colour 1C, 2C comprising the temporary support 1C and the areas of colour 21C, 22C, 23C.

Finally, FIG. 9 shows the final stage of the process consisting of the transfer of the fourth colour.

FIG. 10 shows the result obtained by the superimposition of the various colours.

In the upper part of FIG. 10, only the various colours have been shown in the extension of the corresponding areas of colour. Thus cyan, red, reddish black, green, yellow, red, a dark surface and a deep black are obtained.

The characteristics of the laser beam used to produce the colour images in accordance with FIG. 2 are chosen according to the nature of the inks used, the thickness of the inks, etc.

Generally, the pencil of laser light is sufficiently concentrated, accurate and powerful to leave remaining only the image formed by points conforming to a defined line density, a minimum size of points corresponding to the desired quality of image.

The line density most commonly used is 60 lines/cm; other line densities are possible. This colour image has inked points of variable sizes, showing gradations and areas without shades either with or without dark zones.

At the end of the process, the images can, depending on circumstances, be fixed to the permanent support using cold or hot adhesives so as to provide a solid final image. The transfer of the images and their fixing is carried out manually or mechanically according to the productivity desired, the length of run, etc.

In the same way, it is clear that, for the transfer of the different colours, an accurate register is observed, for example by means of pins.

The process of the invention can be used to serve as a colour output from the processing of computer images, and also to make proofs produced from graphic or test films and the creation of printing form before the printing or printed circuit process.

I claim:

1. A process for multi-color printing comprising:
   a. providing as a temporary support a first sheet with a first layer of a first color material thereon;
   b. by use of a laser beam, destroying an area of said first layer of said first color material to leave a first image of said first color material;
   c. applying said first image of said first color material to a permanent support to transfer said first image to said permanent support;
   d. providing a second sheet with a second layer of a second color material thereon;
   e. by use of a laser beam destroying an area of said second layer of said second color material to leave a second image of said second color material;
   f. applying said second image of said second color material to said permanent support with correct register relative to said first image to transfer said second image to said permanent support, and with said second image of said second material being superimposed over said first image so as to form on said permanent support a combined image of said first and second images.

2. The process as recited in claim 1, wherein said first and second images are applied to said permanent structure by applying said first and second sheets to said permanent support and removing said first and second sheets after the first and second images have been applied to said permanent support.

3. The process as recited in claim 1, wherein each of said first and second color material is of a primary color, and a third image of a third black color material is applied to said permanent support by providing a third sheet with a third layer of a third black color material thereon, destroying by use of a laser beam an area of said third black color material to leave said third image of said third black color material is applied to said permanent support.

4. The process as recited in claim 3, wherein said first and second color material are of different colors.

5. The process as recited in claim 1, wherein said first and second color material are of different colors.

6. The process as recited in claim 1, wherein the permanent support is transparent.

7. The process as recited in claim 1, wherein the permanent support is opaque.

8. The process as recited inc claim 1, wherein the permanent support is colored.

9. The process as recited in claim 1, wherein the permanent support is a metal plated support.

10. The process as recited in claim 1, wherein at the end of the process the combined image is fixed on the permanent support by use of an adhesive material.

* * * * *